United States Patent [19]

Forouhi et al.

[11] Patent Number: 4,618,541

[45] Date of Patent: Oct. 21, 1986

[54] METHOD OF FORMING A SILICON NITRIDE FILM TRANSPARENT TO ULTRAVIOLET RADIATION AND RESULTING ARTICLE

[75] Inventors: Abdul R. Forouhi, San Jose; Bert L. Allen, Los Altos, both of Calif.

[73] Assignee: Advanced Micro Devices, Inc., Sunnyvale, Calif.

[21] Appl. No.: 684,516

[22] Filed: Dec. 21, 1984

[51] Int. Cl.$^4$ .............................................. B44C 5/08
[52] U.S. Cl. ..................................... 428/688; 427/38; 427/94; 427/99; 427/294; 428/704; 428/938
[58] Field of Search .................... 428/688, 704, 938; 427/38, 94, 99, 294

[56] References Cited

PUBLICATIONS

Journal of The Electrochemical Society, Jan. 1978, RAND et al., pp. 99–101.

Primary Examiner—Bernard D. Pianalto
Attorney, Agent, or Firm—Eugene H. Valet; Patrick T. King

[57] ABSTRACT

The ratio of silane-to-ammonia in a reaction designed to deposit a silicon nitride thin film affects the refractive index as well as the absorption coefficient of the film. By controlling the influx of these gases such that an essentially small ratio of silane-to-ammonia exists in a reaction chamber, a silicon nitride film 9 is deposited which is transparent to ultraviolet radiation 4. The exact ratio needed is dependent upon the geometry and operating parameters of the reaction chamber system employed in the deposition process. Ultraviolet light transparent silicon nitride film provides a superior passivation layer 9 for erasable programmable read only memory integrated devices 2.

22 Claims, 8 Drawing Figures

| FILM | λ=6328A° | λ=2537A° | | |
|---|---|---|---|---|
| | n | n | α(×10³cm⁻¹) | T(%) |
| Si₃N₄ | 1.96 | 2.2 | 1.48 | 65 |
| Si₃N₄ + 1% EXCESS Si | 1.98 | 2.194 | 14.3 | 19 |
| Si₃N₄ + 2% EXCESS Si | 2.00 | 2.188 | 27.2 | 5 |
| Si₃N₄ + 3% EXCESS Si | 2.03 | 2.182 | 40.1 | 1.5 |
| Si₃N₄ + 5% EXCESS Si | 2.07 | 2.170 | 65.8 | 0.1 |
| Si₃N₄ + 8% EXCESS Si | 2.14 | 2.152 | 104.4 | 0.0 |
| AMORPHOUS Si | 4.2 | 1.6 | 1.28×10³ | 0.0 |

| ASM SYSTEM | | |
|---|---|---|
| | CONVENTIONAL PARAMETERS | PRESENT INVENTION |
| $SiH_4$ | 600 SCCM | 300 SCCM |
| $NH_3$ | 4500 SCCM | 4500 SCCM |
| TEMP. | 380°C | 400°C |
| PRESSURE | 1.3 TORR. | 1.3 TORR |
| POWER | 1.53 KW | 1.53 KW |
| RF | 50 kHz  30 msec ON  110 msec OFF | 50 kHz  30 msec ON  110 msec OFF |
| RESULTANT REFRACTIVE INDEX | 2.05 ± .05 | 1.93 ± 0.03 |

FIG. 5

| 3300 SYSTEM | | |
|---|---|---|
| | CONVENTIONAL PARAMETERS | PRESENT INVENTION |
| $SiH_4$ | 160 SCCM | 70 |
| $NH_3$ | 210 SCCM | 210 SCCM |
| $N_2$ | 870 SCCM | 960 SCCM |
| RF POWER | 450 WATT 50 KHz | 450 WATT 50 KHz |
| PRESSURE | 0.3 TORR. | 0.3 TORR. |
| TEMPERATURE | 350°C | 350°C |
| RESULTANT REFRACTIVE INDEX | 2.14 | 1.93 ± 0.03 |

FIG. 6

METHOD OF FORMING A SILICON NITRIDE FILM TRANSPARENT TO ULTRAVIOLET RADIATION AND RESULTING ARTICLE

FIELD OF THE INVENTION

The present invention generally relates to integrated circuit films, and more particularly, to a method of forming a passivation layer of silicon nitride which is transparent to ultraviolet light, on a semiconductor integrated circuit, and to an integrated circuit device having a topside layer formed by said method.

BACKGROUND OF THE INVENTION

In the construction of semiconductor integrated circuits, several types of topside layers are currently in use. This topside "passivation layer" is used as a dielectric barrier to protect the underlying circuitry of the integrated circuit from both moisture and contaminants, which can cause corrosion or electric shorts.

In the early development of memory-type integrated circuits, a need became apparent for reprogrammable cells to accomodate project and program development during which specifications and performance criteria often change. This need has been largely supplied by the ultraviolet (UV) radiation erasable programmable read only memory (EPROM) integrated circuit.

Basically, the erase feature is provided by shining ultraviolet light onto the semiconductor chip. This excites the electrons trapped on a floating gate region of the circuit structure and causes the electrons to move off the floating gate.

Obviously, in order to perform the erase function the topside passivation layer of the integrated circuit must be transparent to UV light to a degree sufficient to allow the energy levels of the trapped electrons to be raised to a state where they can diffuse off the gate.

Unfortunately, the only way to remove the trapped gate electrons from the EPROM memory cell is by high intensity UV irradiation through a relatively high-cost clear quartz window, or other UV transparent layer, on the top of the package upon which the chip is mounted.

Silicon nitride is considered to be one of the best compositions for use as a passivation layer on semiconductor integrated circuits as a dielectric. It is known to have a high resistance to moisture and hydrogen penetration which would ruin the circuit. Moreover, diffusivity of various impurities, such as sodium, is much lower in silicon nitride than in other insulators, such as silicon dioxide. Thus, integrated circuits made with a silicon nitride passivation layer are less susceptible to ionic contamination problems.

Silicon nitride is generally deposited by combining silane (SiH$_4$) and ammonia (NH$_3$) by the following chemical vapor deposition (CVD) reaction:

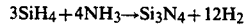

$$3SiH_4 + 4NH_3 \rightarrow Si_3N_4 + 12H_2$$

This pyrolytic reaction can take place at atmospheric pressure both with nitrogen (at approximately 650° C.) or hydrogen (at approximately 1000° C.) as carrier gases. However, these temperatures are impractical for deposition of topside films.

Plasma deposition involves the use of gas reactants, in an evacuated reactor, that are converted into very reactive chemical species with the help of an RF glow discharge and result in vapor deposition of the desired material. Thus the plasma-deposition process is a variation of the CVD process in which a gas plasma replaces the heat-induced decomposition reactions. The most significant difference lies in the lower temperature of the plasma deposition process (approximately 200° to 450° C.), which does not cause a phase change of the underlying metallic alloy film and does not alter the junction depth of transistors.

However, it is commonly believed that silicon nitride deposited by plasma techniques is opaque to UV light at 2537 Angstroms (the wavelength of mercury UV light used to erase EPROM devices). See e.g., K. Alexander, et al., *Moisture Resistive, U.V. Transmissive Passivation for Plastic Encapsulated EPROM Devices*, IEEE International Reliability Physics Symposium, Las Vegas (1984); J. K. Chu, et al., *Plasma CVD Oxynitride as a Dielectric and Passivation Film*, Electrochem. Soc. Ext. Abstr., Vol. 83-2, Abstract No. 321 (1983); M. J. Rand and D. R. Wonsidler, *Optical Absorption as a Control Test for Plasma Silicon Nitride Deposition*, J. Electrochem. Soc. Vol. 125, No. 1, 99 (1978).

Therefore, silicon nitride has been considered unsuitable for use as a passivation layer on UV EPROM devices.

Specifically, with respect to plasma deposited silicon nitride films, it has been reported recently that the refractive index of silicon nitride films is correlated only to the silicon-to-nitrogen ratio created in the reaction chamber, but that there is no good correlation between the silane-to-ammonia ratio and the refractive index. T. E. Nagy, et al., *Silicon Nitride Thin Insulating Films*, Electrochem. Soc. Proceedings, Volume 83-8, (1983).

Based upon these factors, silicon oxynitride films with refractive indices below 1.80 are widely considered to be the films of choice as passivation layers for EPROM packaging. Processes have been developed to yield oxynitride films with refractive indicies of approximately 1.70±0.1. However, erase times of films created in some commercially available plasma deposition systems were found to be much shorter than others. This result, in conjunction with data on integrity of the films, suggested that deposition conditions strongly affect film characteristics. A wide range of deposition parameters, including flows of each participant gas in the reaction, temperature, pressure, RF power and frequency, as well as geometry of the different systems, were thus subject to the investigation leading to the present invention.

Hence, it is an object of the present invention to provide a method of forming a silicon nitride film which is transparent to ultraviolet light.

It is another object of the present invention to provide a plasma deposition method of forming a silicon nitride film for use in the production of semiconductor integrated circuits.

A further object of the present invention is to provide an improved silicon nitride passivation layer for EPROM integrated circuits.

Yet a further object of the present invention is to provide a method of forming a UV light transparent silicon nitride film on an EPROM semiconductor integrated circuit.

SUMMARY OF THE INVENTION

The present invention, in its broad aspect, provides a method of forming an ultraviolet radiation transparent silicon nitride by depositing the film at an essentially small silane-to-ammonia ratio and relatively high temperature. The absorption coefficient and the refractive index of the silicon nitride deposited using said conditions are such that the layer is transparent to ultraviolet light.

Generally, such a film is fabricated in a reaction chamber designed for deposition of thin films, particularly plasma enhanced deposition.

Moreover, the present invention provides a method for fabricating an ultraviolet light transparent silicon nitride passivation layer on an EPROM integrated circuit device.

Other objects, features, and advantages of the present invention will become apparent upon consideration of the following detailed description and the accompanying drawings, in which like reference numerals designate like features throughout the Figures.

BRIEF DESCRIPTION OF THE DRAWINGS

FIG. 5 is a table comparing parameters of operation of plasma deposition of silicon nitride in a system not using a carrier gas; and FIG. 6 is a table showing a comparison of operating parameters for plasma deposition of silicon nitride in a system using nitrogen as a carrier gas.

DETAILED DESCRIPTION OF THE INVENTION

Figures 1, 4:
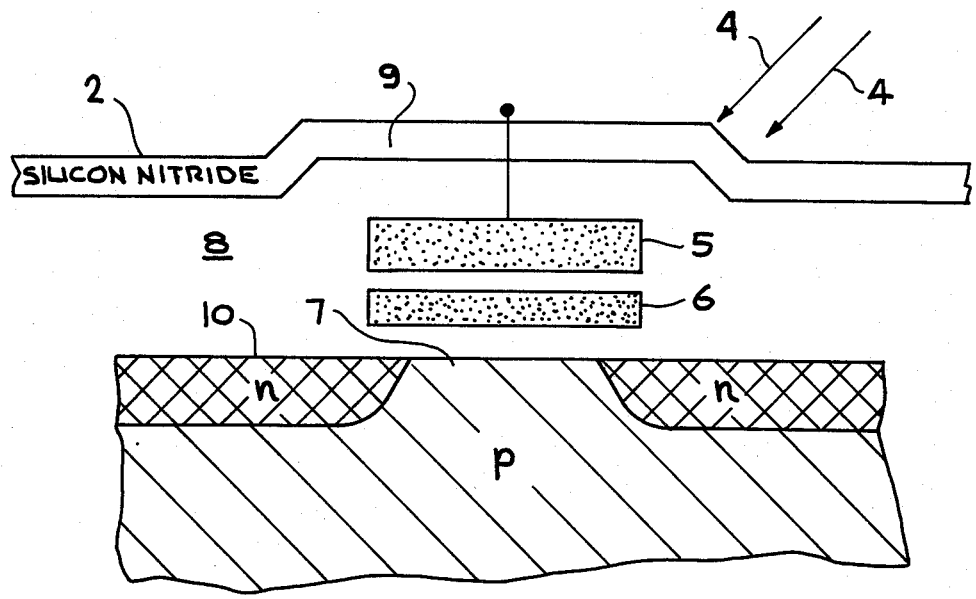
FIG. 1 is a schematic cutaway side-view of an exemplary EPROM semiconductor integrated circuit structure having a passivation layer deposited in accordance with the present invention.
FIG. 4 is a table summarizing the calculated results of changes in the transmittance properties of silicon nitride films with increasing levels of excess silicon over stoichiometric silicon nitride.

Referring to FIG. 1, an exemplary EPROM structure is generally indicated at numeral 2. The operation of EPROM integrated circuits is known in the art. With respect to the present invention, it is relevant to understand that incident UV light, shown as arrows 4, must excite the electrons trapped on a polysilicon floating gate 6 to an extent whereby they will then move off of the floating gate 6, migrating across the insulator layer 8 to control gate 5 and to substrate 7, hence "erasing" the stored memory data bit. For UV light 4 to reach the gate 6 (either directly or as reflected by the boundary surface 10 of the substrate 7), the passivation layer 9 must be largely transparent to light in the ultraviolet wavelength-approximately 2537 Angstroms.

A theoretical model was developed to describe the optical properties of multilayer thin films. To carry out the calculations, theoretical formulae for reflectance and transmittance were adopted in the most general and complete form, taking into account multiple reflections, angle of incidence and polarization of light. The explicit form of these formulae are given in the classical texts on optics of thin films. Energy dependence of the optical constants of the films because the focus of the investigation.

Optical properties of any medium are best described by a complex refractive index $N = n - ik$ (where i is the square root of minus 1). Values of refractive index, n, and extinction coefficient, k, vary with the wavelength of the incident light.

The refractive index of pyrolytic silicon nitride as a function of wavelength, $n_N(\lambda)$ is known to obey the following relationship:

$$n_N^2(\lambda) = 1 + a\lambda^2/(\lambda^2 - b^2),$$

where $$a = 2.8939, \text{ and } b = 139.67 \text{ nm}.$$

In the present study, it was assumed that the refractive index of plasma nitride as a function of wavelength, $n(\lambda)$, could be expressed as:

$$n(\lambda) = n_N(\lambda) + n_m - n_N(\lambda_m),$$

wherein $n_m$ is the measured value of the refractive index of the film at wavelengths $\lambda_m$, and $n_N(\lambda_m)$ denotes the value of $n_N(\lambda)$ evaluated at $\lambda_m$.

The extinction coefficient k is related to the absorption coefficient $\alpha$ through $\alpha = 4\pi k\lambda$. The absorption coefficient of an amorphous dielectric can be expressed as $\alpha = A(E - E_g)^2/E$ for $\alpha \geq \alpha_c$ and $\alpha = B \exp(E/\Gamma)$ for $\alpha < \alpha_c$, where E is the photon energy, $E_g$ is the energy band gap of the dielectric, A and $\Gamma$ are constants depending on the nature of the amorphous film and B is a constant which can be evaluated if $E_g$, A, $\Gamma$ and the cross-over value of $\alpha$, i.e. $\alpha_c$, are given. The relationship between photon energy and the wavelength of the incident radiation is given by $E = hc/\lambda$ where h is Planck's constant and c is speed of light in vacuum.

For an experimental model, silicon nitride films were deposited on a bare silicon single crystal substrate in a plasma reactor, using $SiH_4$, $NH_3$ and $N_2$ gases with varied silane-to-ammonia gas flow ratio and constant total gas flow. Refractive index of the deposited films at 632.8 nm (the helium-neon laser wavelength) were measured using a Rudolph ellipsometer. The thickness of the films were then measured, with the knowledge of their refractive indicies, using a Nanospec thickness gauge. An HP spectrophotometer was utilized to obtain reflectance versus wavelength of the incident light in the 200 nm to 800 nm range. The angle of incidence was fixed at 30°.

Figure 2A:
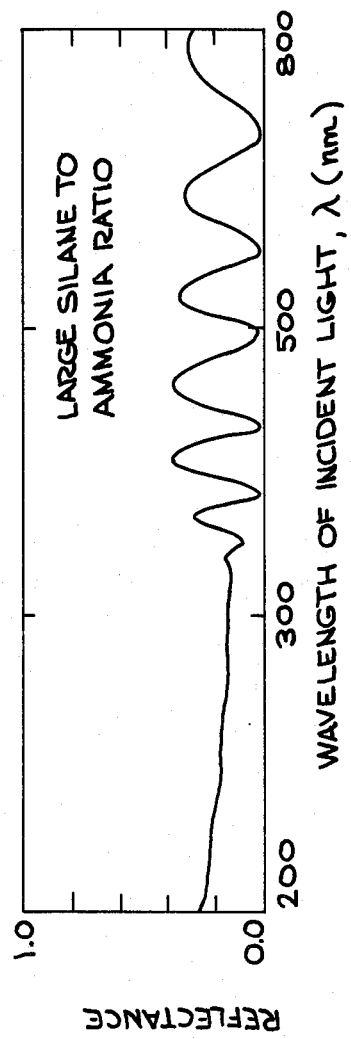
FIG. 2a is a graphical representation of the results of a calculated relationship of reflectance of a silicon nitride thin film versus wavelength of the incident light when the silane-to-ammonia ratio used in the deposition reaction is relatively large.
Figure 2B:
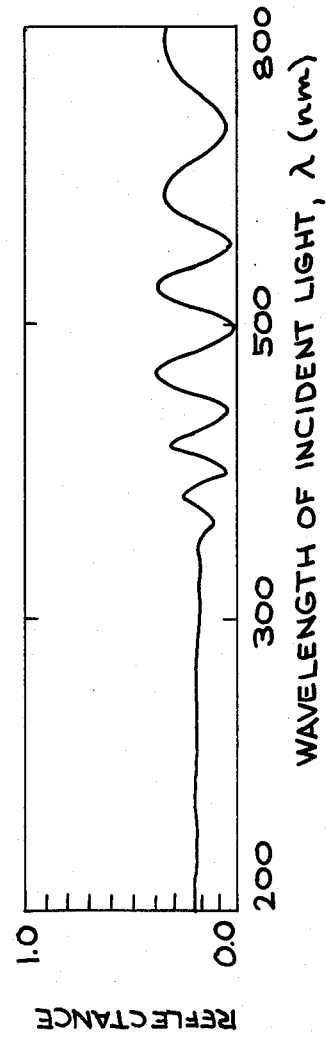
FIG. 2b is a graphical representation of the results of the measured relationship of reflectance of a silicon nitride thin film versus wavelength of the incident light when the silane-to-ammonia ratio used in the deposition reaction is relatively large.
Figure 3A:
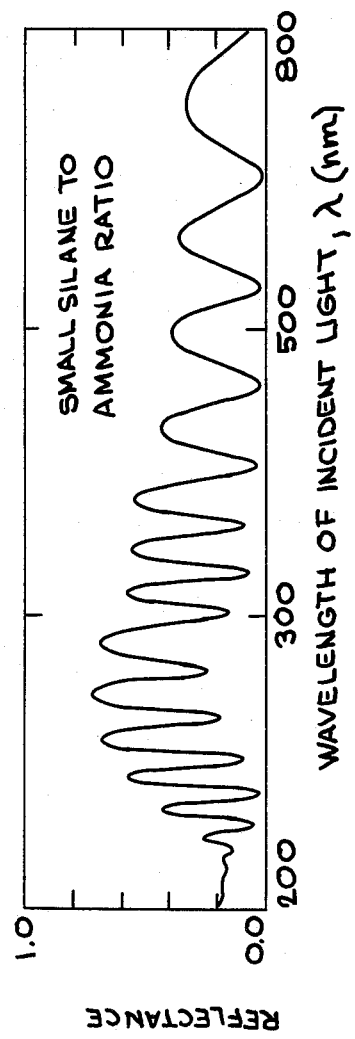
FIG. 3a is a graphical representation of the results of a calculated relationship of reflectance of a silicon nitride thin film versus wavelength of the incident light when the silane-to-ammonia ratio used in the deposition reaction is relatively small.
Figure 3B:
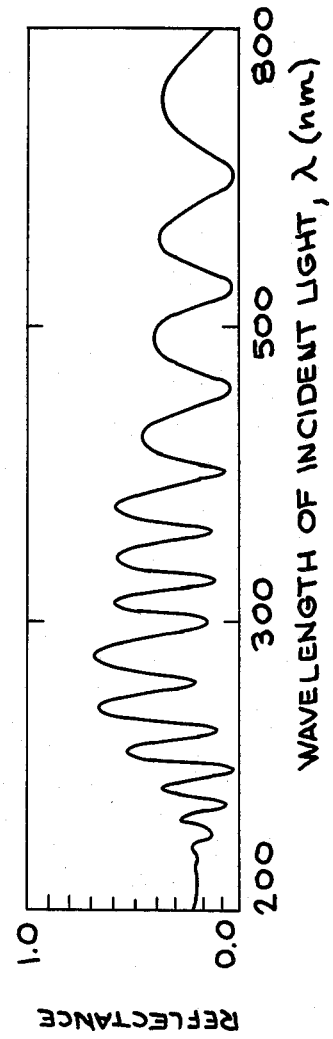
FIG. 3b is a graphical representation of the results of a measured relationship of reflectance of a silicon nitride thin film versus wavelength of the incident light when the silane-to-ammonia ratio used in the deposition reaction is relatively small.

FIGS. 2 and 3 show the resultant theoretical and experimental reflectance versus wavelength, from silicon nitride processed with "large" and "small" $SiH_4$-to-$NH_3$ ratios. The measured refractive indices of "large" and "small" ratio films are, respectively, 2.14 and 1.93. The corresponding measured thicknesses of the films are, respectively, 765 nm and 770 nm. Values of various other parameters used for the simulation are given in the Figures' captions. These values yielded the excellent fit between experimental and theoretical spectra shown in the Figures.

Transmittance of these films can be calculated based on the knowledge of their optical constants. Calculations demonstrated that only a slight percentage of excess silicon in stoichiometric silicon nitride would decrease transmittance, T, by orders of magnitude. The results for films 1 $\mu$m thick on a quartz substrate are summarized in the table of FIG. 4. Here, $\lambda = 6328 A°$ is the wavelength of the visible helium-neon laser light used to measure the refractive index. Refractive index, n, and absorption coefficient, $\alpha$, for any medium depend on the energy and thereby, the wavelength of the incident radiation. The absorption coefficient is a strong measure of absorptance. In fact, absorptance increases exponentially by (a) increasing the absorption coefficient, keeping the thickness constant, and (b) increasing the thickness, keeping the absorption coefficient constant. In this table, values of n and $\alpha$ for silicon nitride, as well as amorphous Si, are taken from commonly known data. Values of n and $\alpha$ for silicon nitride with excess Si are estimated based on a simple structural model assuming mechanical mixture of silicon nitride and Si. The microstructure of plasma deposited nitride is certainly more complicated due to large amounts (20%) of hydrogen usually incorporated in the films, which tends to reduce n and $\alpha$. The conclusion, however, remains the same: excess silicon in a plasma deposition reaction renders a silicon nitride layer which is opaque to UV light.

The refractive index and energy band gap of stoichiometric silicon nitride are, respectively, 1.96 and 5.2 eV.

Increasing the $SiH_4$ to $NH_3$ ratio increased the refractive index from 1.93 to 2.14 and shifted the energy band gap, $E_g$, from 5.2 eV to 3.0 eV as shown in FIGS. 2 and 3. Therefore, the composition of the "small" ratio film is close to stoichiometric $Si_3N_4$ and the "large" ratio film contains excess Si. The excess silicon in "large" ratio film is estimated to be approximately 8%.

The film with refractive index of 2.14 is vitually opaque to UV light. However, the calculated transmittance of mercury UV at 253.7 nm, through 1 $\mu$m of the film with refractive index of 1.93 equals 65% (this is assuming a quartz substrate with zero extinction coefficient).

Hence, it is concluded that it is the excess silicon which transforms a silicon nitride film into a UV opaque layer unsuitable for UV EPROMs.

Plasma deposition techniques are known in the state of the art of fabrication of semiconductor integrated circuits. Therefore, the present invention process can be carried out with a variety of commercially available equipment. Two embodiments are described herein in detail as performed using the Plasma Enhanced Chemical Vapor Deposition (PECVD) system manufactured by Advanced Semiconductor Materials America, Inc. (ASM), and the AMS 3300, manufactured by Applied Materials Corporation. It is to be understood that parameter variations for the process will vary due to the geometry and operating specifications of the particular plasma deposition machine used to deposit the silicon nitride film on the semiconductor substrate or device.

In one application of the present invention, the ASM system was used. The following steps are those performed in accordance with the prescribed techniques recommended by the manufacturer of the system. The semiconductor device, such as a wafer upon which EPROM circuitry has been fabricated, is loaded into the machine's reaction chamber. The recommended operating temperature of the chamber is 380 degrees Centigrade. Secondly, the chamber is evacuated and the gas inlet and outlet lines are purged to clean the system of any unwanted contaminants.

The next step is to introduce the reactants, silane and ammonia, into the chamber in order to establish a uniform flow over the wafer, establishing a constant pressure. The AMS operating parameters call for a flow ratio of 600 standard cubic centimeters per minute (SCCM) of silane to 4500 SCCM of ammonia, or a ratio of 2:15.

The atmosphere of the reaction chamber is intermittantly irradiated with an RF of 50 kHz to catalyze a plasma environment (by ionizing the particles of gas in the chamber, causing the decomposition of the silane), allowing it to react with the ammonia. silicon nitride is deposited thereby upon the wafer.

However, using the abovesaid parameters introduces excess silicon into the deposit as discussed above and results in a nitride film, with a refractive index of 2.05±0.05, which is opaque to ultraviolet radiation at 2537 Angstroms.

In accordance with the present invention, the temperature of the reaction chamber is raised to 400 degrees Centigrade. (For devices using metal interconnects other than aluminum, the temperature may be operably higher).

Most importantly, for the ASM system the flow ratio of silane-to-ammonia must be reduced by approximately 50%, 300 SCCM silane to 4500 SCCM ammonia, or 1:15. By doing so, the index of refraction of the deposited silicon nitride film is lowered to 1.93±0.03. This film is essentially transparent to ultraviolet radiation. A comparison of the operating parameters of conventional technology to those of the present invention is shown in FIG. 5.

In an alternative embodiment of the present invention, the AMS 3300 system was used to deposit the silicon nitride passivation layer. In the 3300 system of plasma deposition, nitrogen is used as a carrier gas for introducing the flow of silane and ammonia across the surface of the wafer upon which the silicon nitride layer is to be deposited. In the 3300 system, the reaction chamber temperature has an upper practical limit of 350 degrees Centigrade. The carrier gas is used to improve the uniformity of the deposited layer. With the pure nitrogen present, the ratio of silane-to-ammonia is lowered from the recommended 16:21 to 7:21 and the flow of nitrogen is increased by approximately 11%. By doing so, a silicon nitride film having an index of refraction of 1.93±0.03 is achieved.

A comparison of the operating parameters of the 3300 system conventional technology for plasma deposition using nitrogen as a carrier gas to those of the present invention is shown in FIG. 6.

An acceptable thickness for silicon nitride passivation layers is approximately one micron. Deposition rates also vary with machine geometries. For example, the ASM system has a deposition rate of 250 Angstroms per minute. The plasma deposition must be carried on for at least 40 minutes to obtain an acceptable layer. Thicker layers can be deposited by lengthening the reaction times.

Essentially, regardless of the mechanical deposition system used in performing the method taught by the present invention, the ratio of silane-to-ammonia must be carefully adjusted and the temperature raised sufficiently so that silicon in excess of the level which exits in stoichiometrically pure silicon nitride is minimized in order for the layer formed to be transparent to ultraviolet light.

An EPROM having a superior passivation layer of silicon nitride can be thusly fabricated.

Ultraviolet light transparent silicon nitride films deposited in accordance with the above-described techniques allow erasure of an EPROM within three to thirty minutes.

From the foregoing description of the present invention, the preferred embodiments of the invention have been disclosed. It is to be understood that other design variations and modifications are intended to be within the scope of the present invention.

What is claimed is:

1. A method for forming an ultraviolet radiation transparent silicon nitride film on a substrate, comprising:
   heating a reaction chamber;
   placing said substrate into said reaction chamber;
   evacuating said reaction chamber;
   establishing a flow of silane and ammonia, such that an essentially small ratio of silane-to-ammonia atmosphere is established in said chamber;
   passing said flow over said substrate; and
   catalyzing said atmosphere, such that said silane and said ammonia react to deposit an ultraviolet radiation transparent silicon nitride film on said substrate.

2. The method as set forth in claim 1, wherein said step of heating further comprises:
   heating said chamber to approximately 400 degrees Centigrade.

3. The method as set forth in claim 2, wherein said ratio of silane-to-ammonia is approximately 1:15.

4. The method as set forth in claim 2, wherein said step of establishing a flow ratio further comprises:
   introducing silane into said chamber at a rate of approximately 300 SCCM; and
   introducing ammonia into said chamber at a rate of approximatey 4500 SCCM.

5. The method as set forth in claim 1, further comprising:
   using nitrogen as a carrier gas to pass said flow of silane and ammonia over said substrate.

6. The method as set forth in clam 5, wherein said step of heating further comprises:
   heating said chamber to approximately 350° Centigrade.

7. The method as set forth in claim 6, wherein said ratio of silane-to-ammonia is approximately 1:3.

8. The method as set forth in claim 6, wherein the step of establishing a flow further comprises:
   introducing silane into said chamber at a rate of approximately 70 SCCM;
   introducing ammonia into said chamber at a rate of approximately 210 SCCM; and
   introducing nitrogen into said chamber at a rate of approximately 960 SCCM.

9. The method as set forth in claim 4, wherein said step of passing said flow over said substrate further comprises:
   maintaining a flow pressure of approximately 1.3 torr.

10. The method as set forth in claim 8, wherein said step of passing said flow over said substrate further comprises:
    maintaining a flow pressure of approximately 0.3 torr.

11. The method as set forth in claims 9 or 10, wherein said silane and ammonia react to deposit a film of sufficient thickness to form a passivation layer for a semiconductor integrated circuit.

12. The method as set forth in claim 9 or 10, wherein said step of catalyzing said atmosphere further comprises:
    irradiating said atmosphere with radio frequency energy.

13. The method as set forth in claim 11, wherein said thickness is at least one micron.

14. An integrated circuit having an ultraviolet radiation transparent silicon nitride film formed in accordance with the method of claims 1 or 5.

15. A method for plasma deposition of a silicon nitride passivation layer, which is transparent to ultraviolet light, on a semiconductor integrated circuit device, comprising:
    heating a reaction chamber;
    placing said device into said reaction chamber;
    evacuating said reaction chamber;
    establishing a flow of silane and ammonia, such that an essentially small ratio of silane-to-ammonia atmosphere is established in said chamber;
    passing said flow over said device; and
    irradiating said atmosphere with radio frequency energy, such that said silane and said ammonia react to deposit an ultraviolet light transparent silicon nitride passivation layer on said device.

16. The method as set forth in claim 15, wherein said ratio of silane-to-ammonia is approximately 1:15.

17. The method as set forth in claim 15, further comprising:
    using nitrogen as a carrier gas to pass said flow of silane and ammonia over said device.

18. The method as set forth in claim 17, wherein said ratio of silane-to-ammonia is approximately 1:3.

19. An erasable programmable read only memory integrated circuit device having an ultraviolet radiation transparent silicon nitride passivation layer formed in accordance with the method of claims 1 or 15.

20. An improved method for manufacturing a semiconductor device having a silicon nitride passivation layer formed using a conventional plasma deposition reaction chamber process, said improvement characterized by:
    passing silane and ammonia over said semiconductor device within said chamber such that an essentially small ratio of silane-to-ammonia ratio atmosphere is provided in said process, whereby the silicon nitride passivation layer formed on said semiconductor device is transparent to ultraviolet light.

21. An improved method of performing a plasma deposition of a silicon nitride film on an integrated circuit device, including the steps of passing a flow of silane and ammonia gases over said device in an evacuated and heated reaction chamber and irradiating said gases with radio frequency energy such that a plasma enhanced reaction occurs between said silane and said ammonia whereby silicon nitride is deposited on said device, said improvement being characterized by:
    establishing a ratio of silane-to-ammonia such that substantially no excess silicon over a stoichiometric silicon nitride level exists in said film, whereby said film is transparent to ultraviolet light.

22. An improved method of performing a plasma deposition of a silicon nitride film on an integrated circuit device including the steps of passing a flow of silane, ammonia, and nitrogen gases over said device in a evacuated and heated reaction chamber and irradiating said gases with radio frequency energy such that a plasma enhanced reaction occurs between said silane and said ammonia whereby silicon nitride is deposited on said device, said improvement being characterized by:

establishing a ratio of silane-to-ammonia such that substantially no excess silicon over a stoichiometric silicon nitride level exists in said film, whereby said film is transparent to ultraviolet light.

* * * * *